(12) United States Patent
Zhao (10) Patent No.: US 10,417,977 B2
(45) Date of Patent: Sep. 17, 2019

(54) SCAN DRIVING CIRCUIT THAT PROVIDES A SCAN LINE TWO SUB-SCAN SIGNALS WITHIN A SCAN CYCLE, ARRAY SUBSTRATE AND DISPLAY PANEL

(71) Applicant: Wuhan China Star Optoelectronics Technology Co., Ltd., Wuhan, Hubei (CN)

(72) Inventor: Mang Zhao, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 37 days.

(21) Appl. No.: 15/552,277

(22) PCT Filed: May 26, 2017

(86) PCT No.: PCT/CN2017/086185
§ 371 (c)(1),
(2) Date: Aug. 19, 2017

(87) PCT Pub. No.: WO2018/196084
PCT Pub. Date: Nov. 1, 2018

(65) Prior Publication Data
US 2018/0330678 A1 Nov. 15, 2018

(30) Foreign Application Priority Data

Apr. 27, 2017 (CN) .......................... 2017 1 0290786

(51) Int. Cl.
*G06F 3/038* (2013.01)
*G09G 3/36* (2006.01)
(Continued)

(52) U.S. Cl.
CPC ......... *G09G 3/3607* (2013.01); *G09G 3/3677* (2013.01); *G02F 1/1368* (2013.01);
(Continued)

(58) Field of Classification Search
None
See application file for complete search history.

(56) References Cited

U.S. PATENT DOCUMENTS

2003/0227429 A1* 12/2003 Shimoshikiryo ............................ G02F 1/134336
345/90
2016/0180790 A1* 6/2016 Park .................... G09G 3/34
345/92

* cited by examiner

*Primary Examiner* — Lunyi Lao
*Assistant Examiner* — Kirk W Hermann
(74) *Attorney, Agent, or Firm* — Andrew C. Cheng (57) ABSTRACT

A scan driving circuit, and an array substrate and a display panel having the scan driving circuit are disclosed. The scan driving circuit includes a plurality of cascaded scan driving units. Each scan driving unit includes an input unit and an output unit. The input unit receives the activation trigger signal, transmits to the output unit and controls the output units in a scanning state. The scan driving unit includes a scan signal modulation unit having at least two transistors. The transistors output a clock modulation signal according to a plurality of clock signals. The clock modulation signal includes at least two first voltages separated with predetermined duration. The output unit outputs scan driving signal from the scan signal output end according to the clock modulation signal. The scan signal includes two sub-scan signals to control pixel unit to receive image data within a scan cycle.

15 Claims, 7 Drawing Sheets

(51) Int. Cl.
  *G09G 5/00*     (2006.01)
  *G02F 1/1368*   (2006.01)
  *G02F 1/1362*   (2006.01)
  *G09G 3/3266*   (2016.01)

(52) U.S. Cl.
  CPC ..... *G02F 1/136286* (2013.01); *G09G 3/3266* (2013.01); *G09G 2300/0426* (2013.01); *G09G 2310/0286* (2013.01); *G09G 2320/0242* (2013.01)

SCAN DRIVING CIRCUIT THAT PROVIDES A SCAN LINE TWO SUB-SCAN SIGNALS WITHIN A SCAN CYCLE, ARRAY SUBSTRATE AND DISPLAY PANEL

CROSS REFERENCE

This application claims the priority of Chinese Patent Application No. 201710290786.9 filed on Apr. 27, 2017, titled "Scan Driving Circuit, Array Substrate and Display panel". The contents of the aforementioned prior application are incorporated herein by reference.

BACKGROUND OF THE INVENTION

1. Field of the Invention

The present invention relates to the field of display, and in particular to the field of a image display scan driving of display device.

2. The Related Arts

To solve the problem of color washout in viewing angle of display, a pixel is divided into two sub-pixels, i.e., a main sub-pixel and a secondary sub-pixel. The difference in driving voltages for the two sub-pixels is used to form different optical characteristics to improve the color washout in viewing angle. The driving method for the pixel of the structure mainly uses different data lines in the same scan cycle at different times to provide the main sub-pixel and the secondary sub-pixel with different driving voltage (image data voltage). This pixel structure can be called 1 G2D (1 gate 2 dots). However, the scan signal outputted by the scan driver/gate driver of the 1 G2D pixel structure cannot flexibly adjust the time of receiving the driving voltage of the two sub-pixels, so that the structure of the scan driving circuit in this pixel structure is complicated.

SUMMARY OF THE INVENTION

To solve the aforementioned technical problems, the present invention provides a simply-structured scan driving circuit.

Moreover, the present invention also provides an array substrate and display panel with the aforementioned scan driving circuit.

A scan driving circuit comprises: n sequentially cascaded scan driving units, each of the scan driving unit at least comprising: an activation trigger end, a scan signal output end and a plurality of clock signal ends, wherein the activation trigger end of an i-th scan driving unit being electrically connected to the scan signal output end of an (i−t)-th scan driving unit, the scan signal output end being for outputting a scan signal and electrically connected to the activation trigger end of an (i+t)-th scan driving unit; each scan driving unit comprising: an output unit electrically connected to the activation trigger end and an output unit electrically connected to the scan signal output end; wherein, the input unit being for receiving an activation trigger signal and transmitting to the output unit, and controlling the output unit to be in a scanning state; the scan driving unit further comprising a scan signal modulation unit having a plurality of transistors connected in a diode manner, the plurality of the transistors being connected to the plurality of the clock signal ends and outputting a clock modulation signal according to the plurality of clock signals, the clock modulation signal comprising at least two first voltages spaced apart for a predetermined duration; the output unit outputting a scan driving signal from the scan signal output end in response to the clock modulation signal when in the scanning state; the scan signal comprising two sub-scan signals spaced apart for the predetermined duration; each sub-scan signal corresponding to one first voltage of the clock modulated signal for controlling a pixel unit receiving image signal in a scan cycle, the pixel unit comprising two sub-pixels, n being a natural number greater than 1, and i being a natural number less than n.

An array substrate, characterized in that, the array substrate comprises a first region and a second region, wherein the first region comprises 2n scan lines and a plurality of pixels electrically connected to the scan lines, the 2n scan lines being insulated and arranged in parallel to each other; the second region being provided with the aforementioned scan driving circuit, with each scan driving unit electrically connected to a scan line for outputting the scan signal to the pixel unit electrically connected to the scan line for controlling the pixel unit to receive an image signal to be displayed; wherein, two aforementioned scan driving circuits being provided at opposite ends of the 2n scan lines, and any two adjacent scan lines being respectively connected to the oppositely provided two scan driving circuits; wherein the scan driving circuit being formed by the same process as the pixel unit.

A display panel comprises the aforementioned array substrate and an opposite substrate provided opposite to the array substrate, the display panel comprising an active area for displaying image and a non-active area surrounding the active area; wherein, the first region of the array substrate corresponding to the active area and the second region corresponding to the non-active area.

Compared to the known techniques, the scan driving circuit, by using at least two transistors connected in an diode manner, modulates the waveform of the scan signal to make the scan signal flexible and stable to performing scanning on the two sub-pixels of a pixel unit so that the two sub-pixels can receive, in different time period, image data voltages to be displayed to display the image.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort.

DETAILED DESCRIPTION OF THE PREFERRED EMBODIMENTS

To further explain the technical means and effect of the present invention, the following refers to embodiments and drawings for detailed description. Apparently, the described embodiments are merely some embodiments of the present invention, instead of all embodiments. All other embodiments based on embodiments in the present invention and obtained by those skilled in the art without departing from the creative work of the present invention are within the scope of the present invention.

Figure 1:
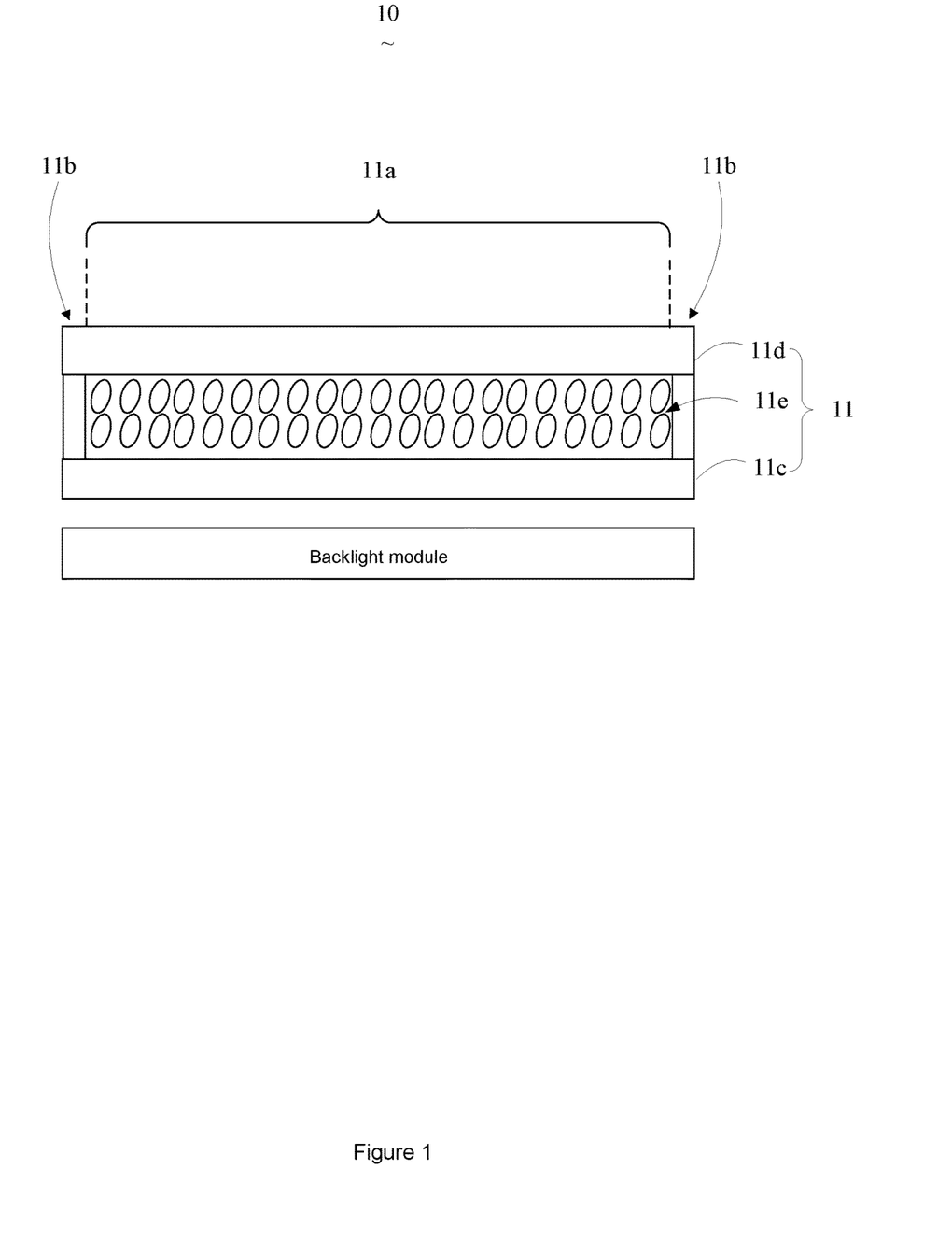
FIG. 1 is a schematic view showing the structure of an embodiment of the display device of the present invention.

FIG. 1 is a schematic view showing the structure of an embodiment of the display device of the present invention. As shown in FIG. 1, a display device 10 comprises a display panel 11 and an optical module (not shown), wherein the display panel 11 comprises an active area 11a and a non-active area 11b. The active area 11a is for image display, and the non-active area 11b surrounds the active area 11a and is a non-light-emitting area, thus, not for image display. Wherein, the display panel 11 further comprises an array substrate 11c and an opposite substrate 11d, and a liquid crystal (LC) layer 11e sandwiched between the array substrate 11c and the opposite substrate 11d. In the present embodiment, the display device 10 and the display panel 11 use the LC as a display medium. Apparently, in other embodiments of the present invention, the display device 10 and the display panel 11 can also use organic electroluminescence diode (OLED) as the display medium, and not limited to that.

Figure 2:
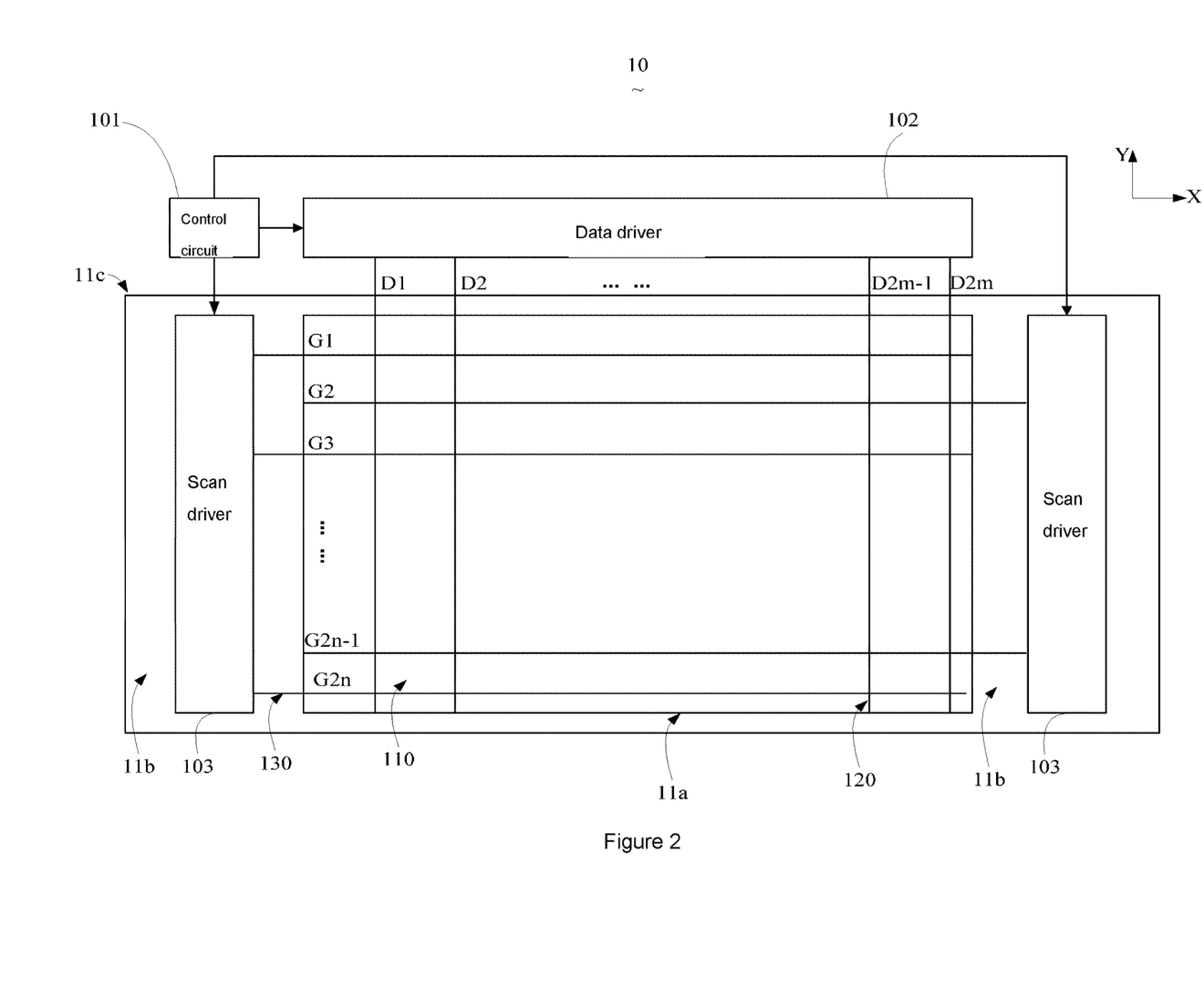
FIG. 2 is a schematic view showing the planar structure of the array substrate of the display panel in FIG. 1.

Refer to FIG. 2. FIG. 2 is a schematic view showing the planar structure of the array substrate of the display panel in FIG. 1. As shown in FIG. 2, a first region (not marked) of the array substrate 11c corresponding to the active area 11c comprises 2m*2n pixels 110 arranged in an array, 2m data lines 120, and 2n scan lines 130, with n and m being natural numbers greater than 1. Wherein, the plurality of data lines 120 are arranged in parallel, mutually insulated and spaced apart with a first predetermined distance along a first direction Y, and the plurality of scan lines 130 are arranged in parallel, mutually insulated and spaced apart with a second predetermined distance along a second direction X. The plurality of data lines 120 and the plurality of scan lines 130 are also mutually insulated from one another. The first direction X and the second direction Y are mutually perpendicular. For simplicity of explanation, the 2m data lines 120 are defined as D1, D2, . . . , D2m−1, D2m; and the 2n scan lines are defined as G1, G2, . . . , G2n−1, G2n. The plurality of pixel units 110 are disposed respectively in an array formed by the plurality of data lines 120 and the scan lines 130, and are electrically connected to corresponding data lines 120 and scan lines 130 respectively.

In corresponding to the non-active area 11b of the display panel 11, the display device 10 further comprises a control circuit 101 for driving pixel array 110 to display image, a data driver 102 and a scan driver 103, disposed in a second region (not marked) of the array substrate 11c. Wherein, the data driver 102 is electrically connected to the plurality of data lines 120 for transmitting the image data to be displayed in a form of data voltage through the plurality of data lines 120 to the plurality of pixel units 110. The scan driving circuit 103 is for electrical connection to the plurality of scan lines 130 to output scan signals through the plurality of scan lines to control the pixel units 110 when to receive image data to display image. The control circuit 101 is electrically connected respectively to the data driver 102 and scan driver 103 for controlling the operation timing of the data driver 102 and scan driver 103, i.e., to output corresponding timing control signal to data driver 102 and scan driver 103.

In the present embodiment, the scan driver 103 is disposed directly in the non-active area 11b (not marked) of the display panel 11, the control circuit and the data driver 102 are independently disposed on other carrier circuit board than the array substrate 11c. In the present embodiment, the electrical elements of the scan driver circuit 103 and the pixel units 110 of the display panel 11 are fabricated in the same process on the display panel 11, i.e., gate on array (GOA) technology. Moreover, the pixel units 110 comprises thin film transistors, pixel electrodes, and so on, which may be fabricated by low temperature poly-silicon (LTPS) process, and apparently the scan driver 103 is also fabricated in the LTPS process.

It should be noted that in the present embodiment, the display panel 11 is described by an example of liquid crystal display (LCD) panel. Each pixel unit 110 must comprise a switch element of thin film transistor (TFT). Therefore, the gate of the TFT is electrically connected to the scan line 130, and the source is electrically connected to the data line 120. Therefore, the data line 120 is called source line and the scan line 130 is also called gate line. Correspondingly, the data driver 102 is called source driver, and the scan driver 103 is also called gate driver.

It should be noted that the display device 10 further comprises other auxiliary circuits to achieve display image, such as, graphics processing unit (GPU), power supply circuit, and so on, and the details will not be described in the present embodiment.

Figure 3:
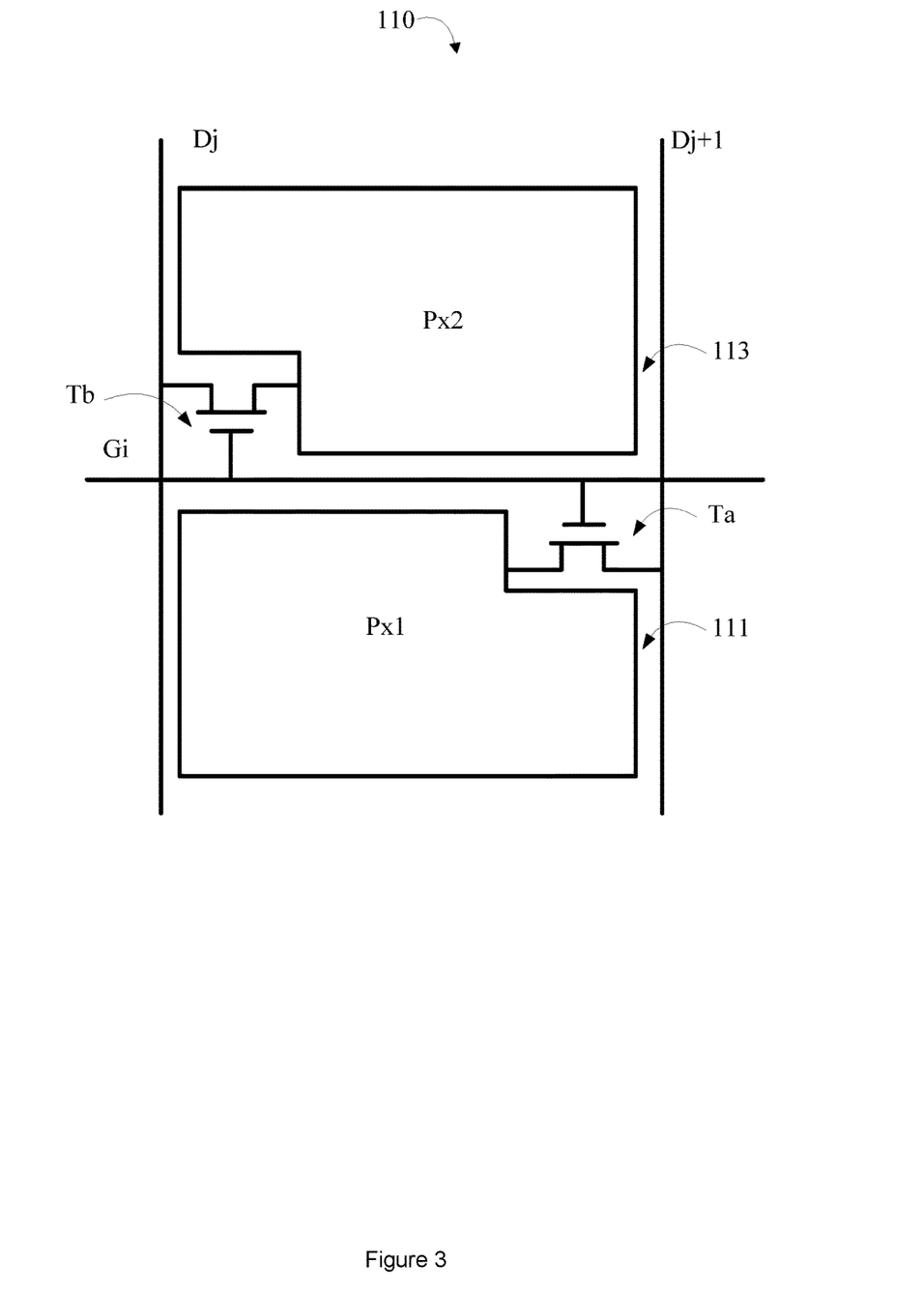
FIG. 3 is a schematic view showing the connection of a pixel unit to the data line and scan line in FIG. 2.

Moreover, refer to FIG. 3. FIG. 3 is a schematic view showing the connection of a pixel unit 110 to the data line 120 and scan line 130 in FIG. 2.

As shown in FIG. 3, a pixel unit 110 comprises two sub-pixels, defined as a first sub-pixel unit 111 and a second sub-pixel unit 113 respectively; wherein, the first sub-pixel unit 111 comprises a first TFT Ta as a switch element and a first sub-pixel Px1, the first sub-pixel Px1 is electrically connected to the drain (not marked) of the first TFT Ta, the source (not marked) of the first TFT Ta is electrically connected to the data line Dj, and the gate (not marked) of the first TFT Ta is electrically connected to the scan line Gi.

The second sub-pixel unit 113 comprises a second TFT Tb as a switch element and a second sub-pixel Px2, the second sub-pixel Px2 is electrically connected to the drain (not marked) of the second TFT Tb, the source (not marked) of the second TFT Tb is electrically connected to the data line Dj+1, and the gate (not marked) of the second TFT Tb is also electrically connected to the scan line Gi.

During a scan cycle of an image, in a first time period, the scan line Gn transmits the scan signal Sc1 to control the first TFT Ta become conductive, the data voltage (image signal) on the data line Dj is transmitted to the first sub-pixel Px1 so as to make the first sub-pixel Px1 to display image. In a second time period, the scan line Gn transmits the scan signal Sc2 to control the second TFT Tb become conductive, the data voltage (image signal) on the data line Dj+1 is transmitted to the second sub-pixel Px2 so as to make the second sub-pixel Px2 to display image. Wherein, the first time period and the second time period are spaced apart by a buffer time to enable the two sub-pixel units to receive data voltage stably, with i a natural number less than 2n, and j a natural number less than 2m.

Figure 4:
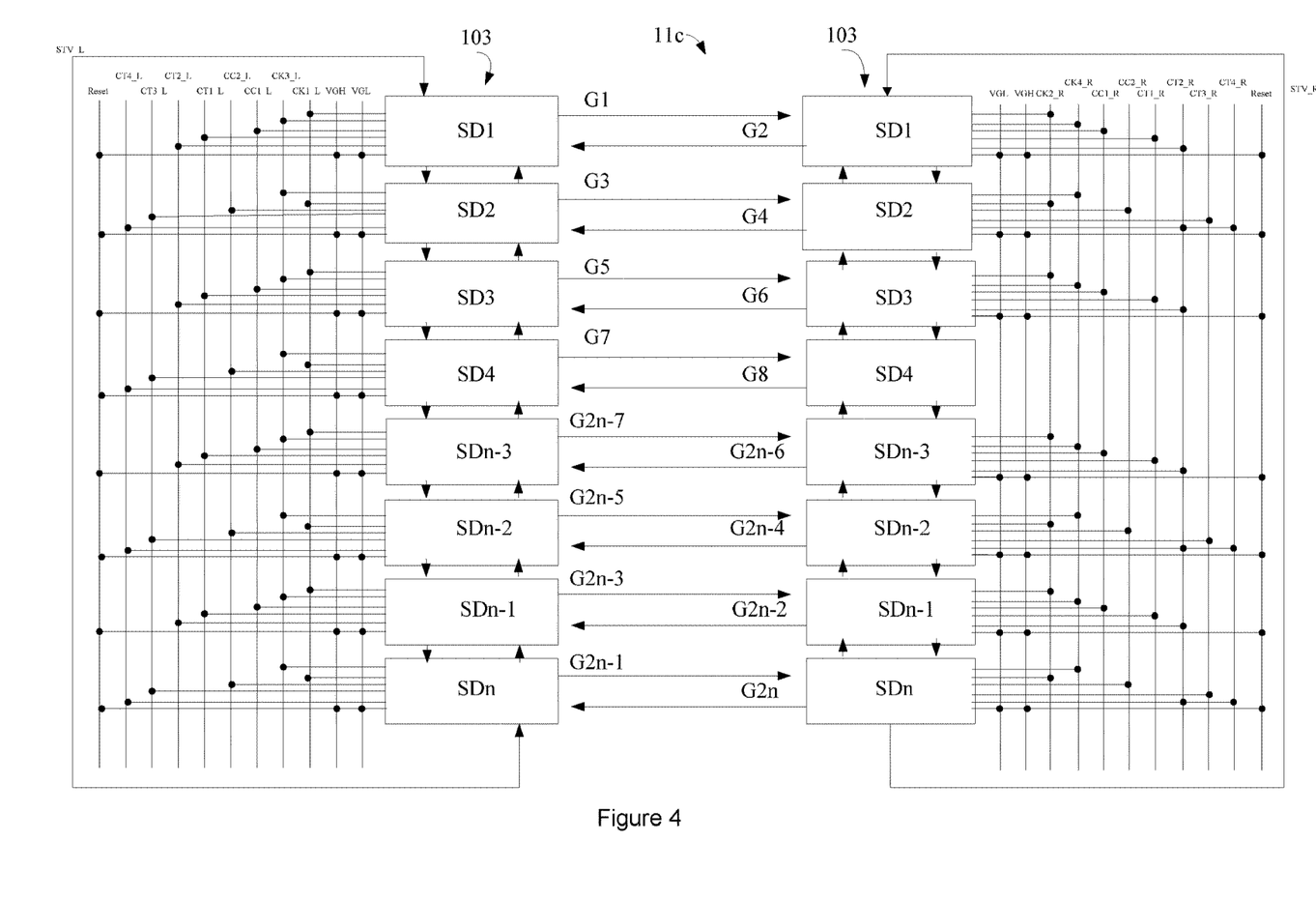
FIG. 4 is a schematic view showing the connection of the scan driving circuit of the display panel to the scan line in FIG. 2.

Refer to FIG. 4. FIG. 4 is a schematic view showing the connection of the scan driving circuit 103 of the display panel 11 to the scan line 130 in FIG. 2. As shown in FIG. 4, two scan driving circuits 103 are disposed respectively at two opposite sides of the array substrate 11c corresponding to non-active area 11b.

The two scan driving circuits are defined respectively as a first scan driving circuit 103a and a second scan driving circuit 103b. The first scan driving circuit 103a and the second scan driving circuit 103b are electrically connected respectively to n scan lines, i.e., dividing the scan lines 130 into two sets of n scan lines. The two sets of scan lines are disposed mutually with space apart, and the two sets are electrically connected respectively with the first scan driving circuit 103a and the second driving circuit 103b. In the present embodiment, n is 1920.

Specifically, each scan driving circuit 103 comprises n scan driving units Sd1-SDn, the n scan driving units SD1-SDn are electrically connected to the n scan lines 130 respectively and output corresponding n scan signals in accordance with timing to the n scan lines 130 to control the electrically connected pixel units 110 to be in a state able to receive data voltage. The n scan driving units SD1-SDn are sequentially cascaded in stages, i.e., the scan output end Gn−1 of the (n−1)-th scan driving unit SDn−1 is electrically connected to the input trigger end Pin of the n-th scan driving unit SDn, the scan output end Gn of the n-th scan driving unit SDn is electrically connected to the input trigger end Pin of the (n+1)-th scan driving unit SDn+1, and so on. Apparently, for the first scan driving circuit 103a, the scan driving units SD1-SDn are electrically connected to the scan lines G1, G3, . . . , G2n−1 respectively, and output the corresponding scan signals Sc1, Sc3, . . . , Sc2n−3, Sc2n−1; for the second scan driving circuit 103b, the scan driving units SD1-SDn are electrically connected to the scan lines G2, G4, . . . , G2n respectively, and output the corresponding scan signals Sc2, Sc4, . . . , Sc2n−2, Sc2n. As such, any two adjacent scan lines 130 are electrically connected to the first scan driving circuit 103a and the second scan driving circuit 103b respectively. Therefore, the routing complexity and the required area for the scan lines 130 and the scan driving circuit 103 are effectively reduced.

The first scan driving circuit 103a at least comprises 12 signal control ends, which are activation signal end STV_L, reset signal end Reset, timing control signal ends CT4_L, CT3_L, CT2_L, CT1_L, CC2_L, CC1_L, CK3_L, CK1_L, high voltage end VGH_L, and low voltage end VGL_L; wherein the activation signal end STV_L, reset signal end Reset, timing control signal ends CT4_L, CT3_L, CT2_L, CT1_L, CC2_L, CC1_L, CK3_L, CK1_L are electrically connected to the control circuit 101 to respectively receive control signals and timing signals outputted by the control circuit 101. In the present embodiment, for convenience of explanation, the outputted control signals and timing signals have the same symbols as the receiving ends.

Accordingly, the timing control signal ends CT4_L, CT3_L, CT2_L, CT1_L, CC2_L, CC1_L, CK3_L, CK1_L are divided into two groups, with timing control signal ends CT2_L, CT1_L, CC1_L, CK3_L, CK1_L as a first group and the timing control signal ends CT4_L, CT3_L, CC2_L, CK3_L, CK1_L as a second group. The even-numbered scan driving units SD2i and the first timing control signal ends are electrically connected, and the odd-numbered scan driving units SD2i−1 are electrically connected.

Similarly, the second scan driving circuit 103b at least comprises 12 signal control ends, which are activation signal end STV_R, reset signal end Reset, timing control signal ends CT4_R, CT3_R, CT2_R, CT1_R, CC2_R, CC1_R, CK3_R, CK1_R, high voltage end VGH_R, and low voltage end VGL_R; wherein the activation signal end STV_L, reset signal end Reset, timing control signal ends CT4_R, CT3_R, CT2_R, CT1_R, CC2_R, CC1_R, CK3_R, CK1_R, are electrically connected to the control circuit 101 to respectively receive control signals and timing signals outputted by the control circuit 101. A high voltage end VGH is for outputting a high voltage signal VGH for a first reference voltage and the first reference voltage is at least 3.5V; a low voltage end VGL is for outputting a low voltage signal VGL for a second reference voltage and the second reference voltage is 0V. The timing control signal ends CC2_L, CC1_L, CC2_R, CC1_R can be used as buffer clock signal ends, and the outputted buffer clock signals are for controlling the corresponding scan driving units to stop outputting scan signals. CT4_L, CT3_L, CT2_L, CT1_L, CK3_L, CT4_R, CT3_R, CT2_R, CT1_R, CK3_R can be used as scan clock signal ends, and the outputted scan clock signals are for controlling the corresponding scan driving units to output scan signals. CK1_L and CK3_R are used as pull-down clock signal ends, and the outputted pull-down clock signals are for controlling the corresponding scan driving units to prepare or stop outputting scan driving signals.

Figure 5:
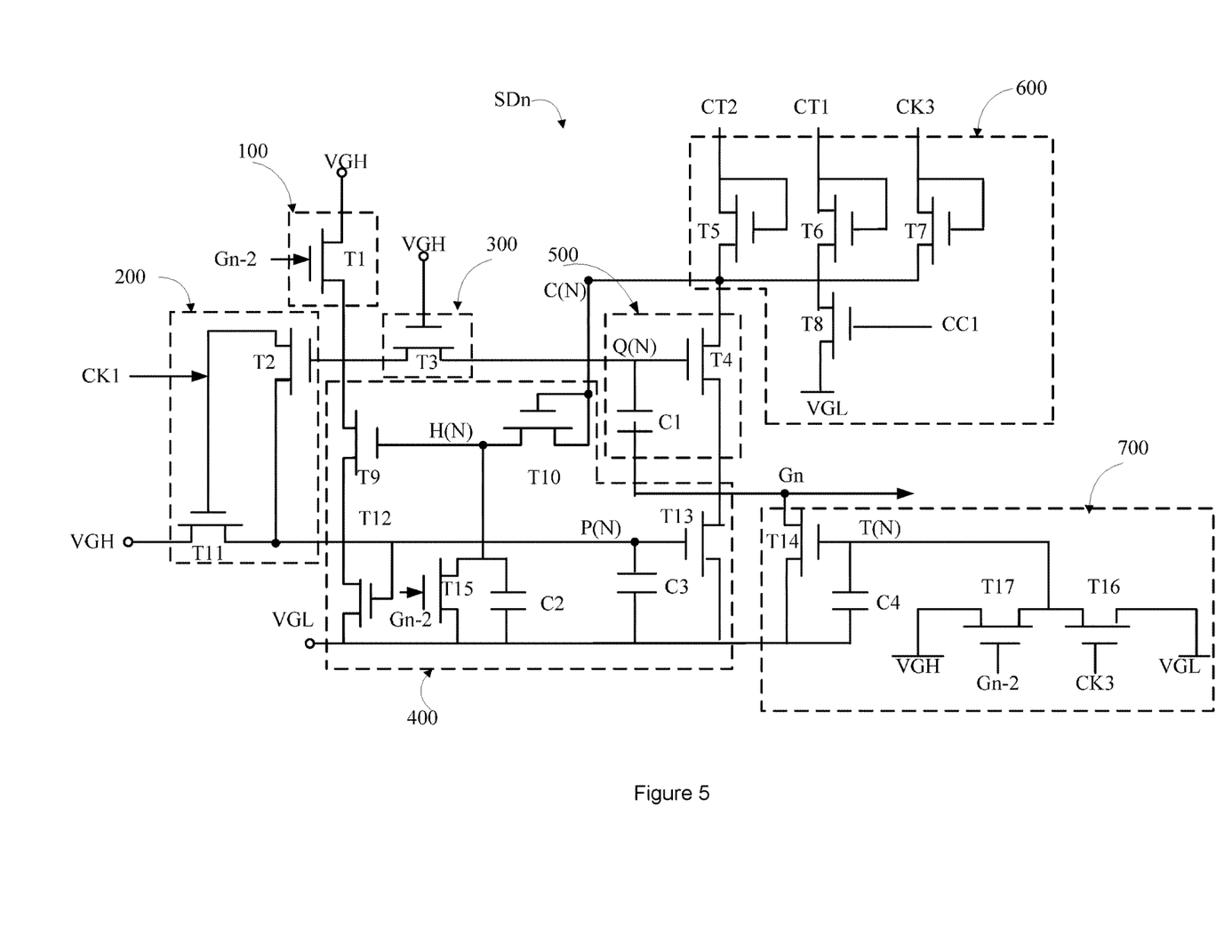
FIG. 5 is a schematic view showing the specific circuit structure of any scan driving unit SDn of the scan driving circuit in FIG. 4.

Refer to FIG. 5. FIG. 5 is a schematic view showing the specific circuit structure of any scan driving unit SDn of the scan driving circuit in FIG. 4.

As shown in FIG. 5, the scan driving unit SDn comprises an input unit 100, a pull-down control unit 200, a regulator unit 300, a first pull-down unit 400, an output unit 500, a scan signal modulation unit 600, and a second pull-down unit 700; wherein, the scan driving unit SD uses transistors T1-T17 and capacitors C1-C4 to form the aforementioned circuit units. Also, the scan driving unit SDn further comprises, in the aforementioned circuits, an output control point Q(N), a first pull-down control point P(N), a first control point H(N), a signal regulation output point C(N) and a second pull-down control point T(N). In the present embodiment, the transistors T1-T17 are all N-Metal-Oxide-Semiconductor (NMOS) transistors.

The present embodiment uses the n-th scan driving unit SDn as an example to describe the specific circuit structure. It should be noted that the other scan driving units have the same structure.

The input unit 100 is for receiving the activation trigger signal STV_L, and outputting corresponding control signals according to the activation trigger signal to achieve transmitting the scan signal Scn−2 outputted from a previous scan driving unit SDn−2. It should be noted, specifically, the input unit 100 comprises a first input end 101, a first output end 103 and a first transistor T1. The first input end 101 is for receiving the scan signal Scn−2 transmitted to the scan line Gn−2, the first transistor T1 has a gate (not marked) electrically connected to the first input end 101, a source (not marked) electrically connected to the high voltage end VGH, and a drain (not marked) electrically connected to the first output end 103; wherein, the input unit 100 outputs a corresponding driving signal from the first output end 103 according to the scan signal Scn−2 received by the first input end 101, and the first transistor T1 is as the input transistor.

The pull-down control unit 200 is for controlling the first pull-down unit 400 to stably output a pull-down signal. Specifically, the pull-down control unit 200 comprises a second transistor T2 and an eleventh transistor T11. The second transistor T2 has a gate (not marked) electrically connected to the first output end 103, a source (not marked) electrically connected to the clock signal end CK1, and a drain (not marked) electrically connected to the first pull-down control point P(N) of the output control unit 400. The eleventh transistor T11 has a gate (not marked) electrically connected to the clock signal end CK1, a source (not marked) electrically connected to the high voltage end VGH, and a drain (not marked) electrically connected to the first pull-down control point P(N) of the output control unit 400. The second transistor T2 is as the first pull-down control transistor, and the eleventh transistor is as the second pull-down control transistor.

The regulator unit 300 is for converting the inputted trigger signal into a more stable high voltage signal and transmitting to the output control point Q(N) of the output unit 500 so that the output unit 500 can stably output scan driving signal Scn to the scan signal output end Gn. Specifically, the regulator unit 300 comprises a third transistor T3, wherein the third transistor T3 has a gate (not marked) electrically connected to the high voltage end VGH, a source (not marked) electrically connected to the output control point Q(N), and a drain (not marked) electrically connected to the first output end 103, and the third transistor T3 is as the regulator transistor.

The first pull-down unit 400 is for outputting pull-down signals to the control output unit 500 to control the output unit 500 and scan signal output end Gn stop outputting scan signal Scn. Specifically, the first pull-down unit 400 comprises a ninth transistor T9, a tenth transistor T10, a twelfth transistor T12, a fifteenth transistor T15, a second capacitor C2 and a third capacitor C3. The ninth transistor T9 has a gate electrically connected to the first control point H(N), a source electrically connected to the first output end 103, and a drain electrically connected to a source of the twelfth transistor T12. The tenth transistor T10 has a gate and a drain directly electrically connected to the signal regulation output point C(N), and a source electrically connected to the first control point H(N), wherein the tenth transistor T10 adopts a diode-manner connection. The twelfth transistor T12 has a gate connected to the first pull-down control point P(N). The thirteenth transistor T13 is as the first pull-down transistor, and the third capacitor is as the pull-down maintaining transistor.

The output unit 500 is for stably outputting scan signal Scn according to the output control point Q(N). Specifically, the output unit 500 comprises a fourth transistor T4 and a first capacitor C1, wherein, the fourth transistor T4 has a gate electrically connected to the output signal control point Q(N0, a source electrically connected to the signal regulation output point C(N), and a drain electrically connected to the scan signal output end Gn. The first capacitor C1 is electrically connected between the signal control point C(N) and the scan signal output end Gn for maintaining the output control point Q(N) in a scanning state. The fourth transistor T4 is as a output control transistor, and the first capacitor C1 is as a capacitor maintaining capacitor. Moreover, when the output control point Q(N) maintains in scanning state, i.e., the output unit 500 is in a state of scan signal outputting.

The scan signal regulation unit 600 is for outputting a clock regulation signal according to a plurality of timing control signals, for controlling the wave form of the scan signal Scn outputted by the scan driving unit SDn so that the scan signal Scn can control the two sub-pixel units of the pixel unit 110 in image displaying. Specifically, the scan signal regulation unit 600 comprises a fifth transistor T5, a sixth transistor T6, a seventh transistor T7 and an eighth transistor T8. The fifth transistor T5 has a gate and a drain directly connected together and electrically connected to the clocks signal end CT2, and a source electrically connected to the signal regulation output point C(N); the sixth transistor T6 has a gate and a drain directly connected together and electrically connected to the clocks signal end CT1, and a source electrically connected to the signal regulation output point C(N); the seventh transistor T7 has a gate and a drain directly connected together and electrically connected to the clocks signal end CT2, and a source electrically connected to the signal regulation output point C(N); in other words, the transistors T5-T7 are all connected in a diode manner. The eighth transistor T8 has a gate electrically connected to the clocks signal end C12, a drain electrically connected to the signal regulation output point C(N), and a source electrically connected to the high voltage end VGH; wherein the eighth transistor T8 is as the buffer transistor.

The second pull-down unit 700 is electrically connected to the scan signal output end Gn, for controlling the scan signal output end Gn to stop outputting scan signals Scn, in other words, for ensuring the scan signal Scn to stay in a state to control the pixel unit 110 to stay stable when in non image display period. Specifically, the pull-down unit 700 comprises a fourteenth transistor T14, a sixteenth transistor T16, a seventeenth transistor T17, and a fourth capacitor C4. The fourteenth transistor T14 has a gate connected to receive the activation trigger signal, and the activation trigger signal is the scan signal Scn−2 outputted by the scan signal output end Gn−1 of the scan driving unit SDn−1. The seventeenth transistor T17 has a source electrically connected to the high voltage end VGH and a drain electrically connected to the second pull-down control point T(N). The sixteenth transistor T16 has a gate electrically connected to the clock signal end CK3, a source electrically connected to the low voltage end VGL, and a drain electrically connected to the second pull-down control point T(N); wherein the fourteenth transistor T14 is as the second pull-down transistor, the seventeenth transistor is as the third pull-down transistor, and the sixteenth transistor is as the fourth pull-down transistor.

Figure 6:
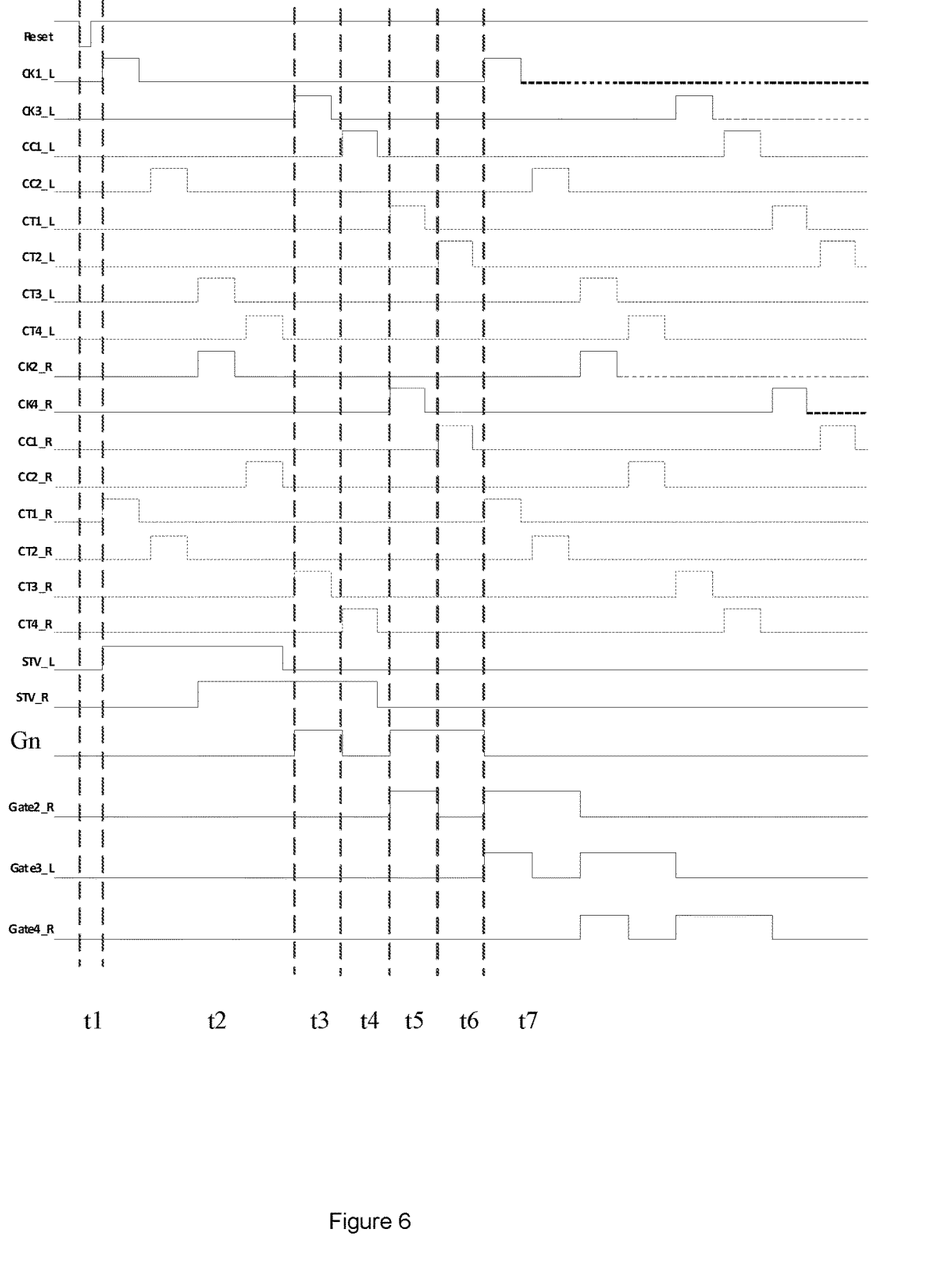
FIG. 6 is a schematic view showing the operation timing sequence of scan driving unit SDn of the scan driving circuit in FIGS. 3-5.

Refer to FIG. 6. FIG. 6 is a schematic view showing the operation timing sequence of scan driving unit SDn of the scan driving circuit 103 of the display panel 11 disposed at the two opposite ends of two adjacent scan lines 130 in FIGS. 3-5. It should be noted that the scan driving unit SDn only shows the timing of the previous pixel unit 110 displaying image to drive the two adjacent scan lines SDn, SDn+1 during a frame image displaying. Moreover, the symbols in the figure STV_L, Reset, CT4_L, CT3_L, CT2_L, CT1_L, CC2_L, CC1_L, CK3_L, CK1_L indicate the driving timing of the scan driving unit at the left side, and STV_R, Reset, CT4_R, CT#_R, CT2_R, CT1_R, CC2_R, CC1_R, CK4_R, CK2_R indicate the driving timing of the scan driving unit at the right side. The aforementioned symbols correspond to the respective waveform of the output signals. Apparently, the waveform corresponding to the scan driving circuit SDn comprises STV_L, Reset, CT2_L, CT1_L, CC1_L, CK3_L, CK1_L.

Because the two scan driving units have the same driving method, the scan driving unit SDn at the left of the scan line 130 is used to describe the operation timing.

As shown in FIG. 6, in the reset period Tr, the reset end Reset is in the enable state so that all the elements in the scan driving unit SDn of the scan driving circuit 103 are in the initial operation state.

Furthermore, in the first time period t1, i.e., the activation trigger stage, the STV_L signal as the activation trigger signal is at the high voltage state, wherein the activation trigger signal targeting the scan driving unit SDn is the scan driving signal Gn−2 of the scan driving unit SDn−1. In the mean time, the clock signal CK1_L is also in the high voltage state. Therefore, referring to both FIG. 5 and FIG. 4, the first transistor T1 is driven by the high voltage of the activation trigger signal STV_L to be in the conductive state, the high voltage signal VGH is transmitted to the drain by the source of the first transistor T1, i.e., transmitted to the first output end 103. When the first output end 103 is at high voltage, the regulator unit 300 transmits the high voltage of the first output end 103 to the output control point Q(N), and the output control point Q(N) stays at high voltage through the first capacitor C1 so that the fourth transistor T4 is in the conductive state. Correspondingly, the clock signals CT2, CT1 and CK3 are all at low voltage. As such, the low voltage regulation signal outputted by the signal regulation output point C(N) is transmitted to the scan signal output end Gn.

In the mean time, the second transistor T2 is in the conductive state under the control of the high voltage of the first output end 103. As such, the clock signal CK1_L is transmitted from the source of the second transistor T2 to the first pull-down control point P(N), and the eleventh transistor T11 is also in the conductive state under the control of the high voltage of the clock signal CK1_L, and the high voltage signal VGH is transmitted synchronously to the first control point P(N), the third capacitor is for maintaining the first pull-down control point P(N) at the high voltage. The thirteen transistor T13 is in the conductive state under the control of the high voltage of the first pull-down control point P(N), and the low voltage signal VGL is transmitted from the source of the thirteenth transistor T13 to the scan signal output end to ensure the stability of the scan signal Scn.

In addition, under the control of the high voltage of STV_L, the fifteenth transistor T15 is in the conductive state, and the low voltage VGL is transmitted from the source of the fifteenth transistor T15 to the first control point H(N) to make the first control point H(N) to be at low voltage.

Corresponding to the pull-down unit 700, under the control of the high voltage of STV_L, the seventeenth transistor T17 is in the conductive state, the high voltage signal VGH is transmitted from the source of the seventeenth transistor T17 to the second pull-down control point T(N) electrically connected to the drain, and the fourth capacitor C4 maintains the high voltage of the second pull-down control point T(N).

During the t2 time period, the clock signal CK1_L becomes low voltage and the clocks signal STV_L stays at high voltage so that the output control point Q(N) stays at high voltage. The conductive second transistor T2 transmits the low voltage of the clock signal CK1_L to the first pull-down control point P(N) so that the first pull-down control point P(N) stays at low voltage. As a result, the scan signal output end Gn maintains stably at low voltage without showing suspending state.

In the third time period t3, the activation trigger signal STV_L finishes triggering, and becomes low voltage from high voltage. In the mean time, the clock signal CK3_L is in the trigger state, i.e., high voltage state. The first transistor T1 is in the cut-off state, and the output control end Q(N) stays at high voltage. In the mean time, the seventh transistor T7 is in the conductive state and showing a smaller internal resistance (impedance) so that the signal regulation point C(N) outputs high voltage signal, and transmits through the fourth transistor T4 to the scan signal output end Gn. As a result, the scan signal output end Gn, during the third time period t3, outputs the first sub-scan signal Sc1, and the first sub-scan signal is used to drive the first sub-pixel Px1, i.e., controls the TFT ta to be in the conductive state to make the data voltage to be displayed Dm transmitted to the first sub-pixel 111.

Accordingly, the third output end 103 is at high voltage under the control of the output control end Q(N). The low voltage of the clock signal CK1_L is transmitted from the source of the second transistor T2 to the first pull-down control point P(N). In the mean time, the signal regulation point C(N) outputs high voltage signal to make the tenth transistor T10 (connected in diode manner) in the conductive state so that the first control point H(N) is at high voltage.

For the pull-down unit 700, the seventeenth transistor T17 is in the cut-off state under the control of the activation trigger signal STV_L, the sixteenth transistor T16 is in the conductive state under the control of the clock signal CK3_L, the low voltage signal is transmitted from the source of the sixteenth transistor T16 to the second pull-down control point T(N) electrically connected to the drain so that the second pull-down control point stays at low voltage to make the fourteenth transistor T14 in the cut-off state.

During the fourth time period t4, the clock signal CK3_L become low voltage and the clock signal CC1_L is in the enable state, i.e., the clock signal CC1_L becomes high voltage. The eighth transistor T8 of the scan signal regulation unit 600 is in the conductive state, and low voltage VGL is transmitted from the source of the eighth transistor T8 to the regulation signal output end C(N) electrically connected to the drain. Because the output control point Q(N) stays at high voltage, i.e., the fourth transistor T4 is still in the conductive state, the low voltage of the signal regulation output end C(N) is transmitted through the fourth transistor T4 to the scan signal output end Gn so that the scan signal outputs the buffer scan signal Sct at low voltage during the time period, so as to control the first sub-pixel Px1 stop receiving data voltage. Wherein, the fourth time period t4 is as the aforementioned predetermined duration.

In the fifth time period t5, the clock signal CC1_L become low voltage from the enable state, and the clock signal CT1_L is in the enable state, i.e., the clock signal CT1_L becomes high voltage. The sixth transistor T6 of the scan signal regulation unit 600 is in the conductive state, and the high voltage of the clock signal CT1_L is transmitted from the sixth transistor T6 to the regulation signal output end C(N) so that the scan signal output end Gn outputs the second sub-scan signal Sc2 during the fifth time period t5. The second sub-scan signal Sc2 is for driving the second sub-pixel Px2, i.e., control the TFT Tb to be in the conductive state so that the data voltage to be displayed Dm+1 is transmitted to the first sub-pixel 111.

Preferably, in the sixth time period t6, the clocks signal CT1_L stops the enable state and becomes low voltage, and the clock signal CT2_L is in the enable state, i.e., the clock signal CT2_L becomes high voltage. The fifth transistor T5 of the scan signal regulation unit 600 is in the conductive state, and the high voltage of the clock signal CT1_L is transmitted again from the fifth transistor T5 to the regulation signal output end C(N) so that the scan signal output end Gn still outputs the second sub-scan signal Sc2 during the sixth time period t6 so that the time the first sub-pixel 111 to receive the data voltage to be displayed Dm+1 is extended.

Apparently, the consecutive outputting two second sub-scan signals Sc2 during the fifth and sixth time period t5, t6 can also be viewed as a sub-scan signal having duration twice of the first sub-scan signal Sc1.

Finally, during the seventh time period t7, the clock signal CK1 is again in the enable state, i.e., becomes high voltage. The first pull-down control point P(N) becomes high voltage through the conductive second transistor T2 so that the low voltage is transmitted through conductive thirteenth transistor T13 to the scan signal output end Gn to achieve the driving of an image frame of a pixel unit, wherein, it should be noted, the time periods t1-t7 are continuous with any space apart. Also, the time periods t1-t7 form a complete scan signal in a scan cycle.

Compared to the known technology, the scan driving circuit 103, by using at least two transistors connected in a diode manner to regulate scan signal waveform, is able to scan the two sub-pixels in the pixel unit flexible and stably to make the two different time periods with predetermined duration apart to receive image data voltage to be displayed for image display.

Figure 7:
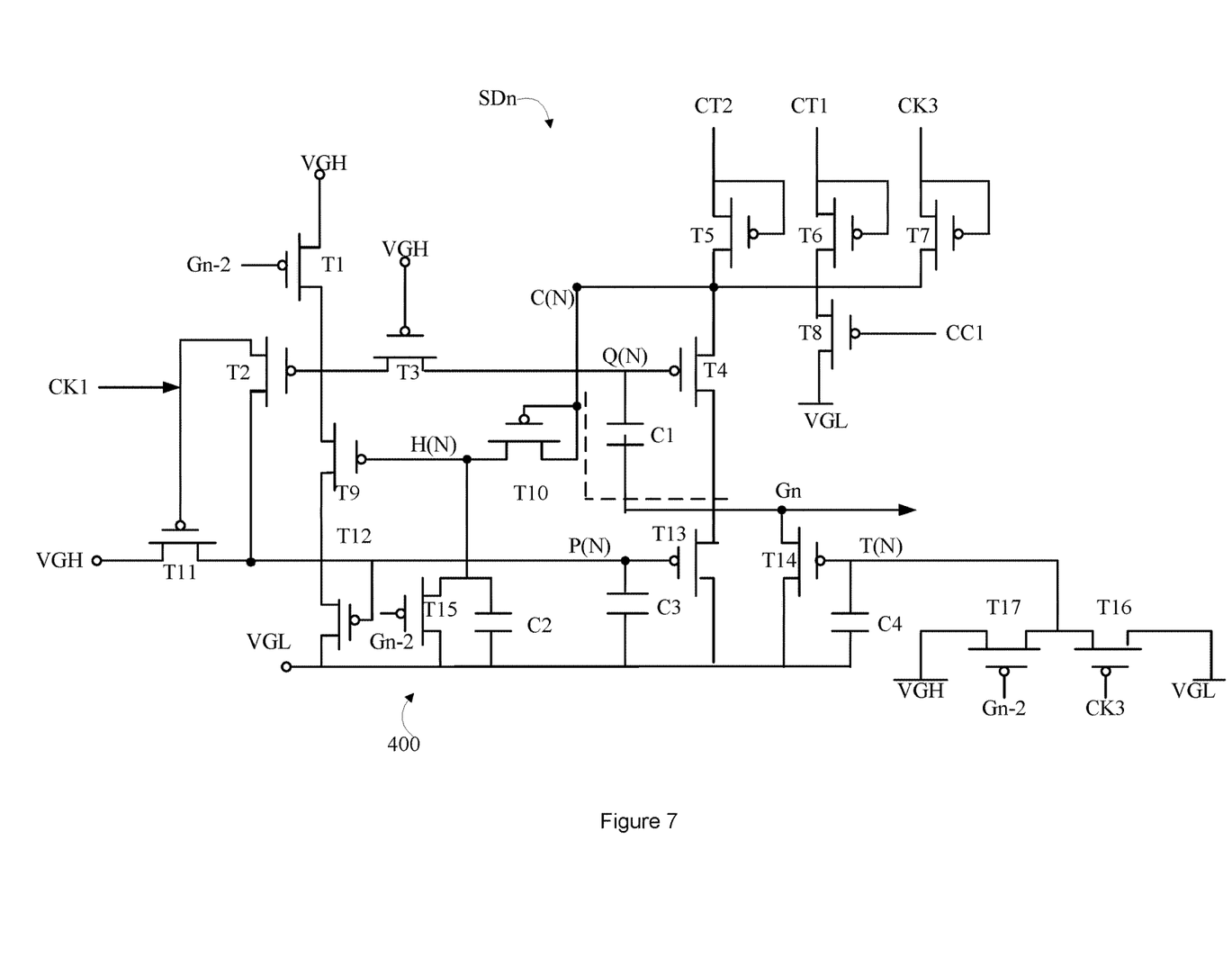
FIG. 7 is a schematic view showing the circuit structure of the scan driving unit SDi according to another embodiment of the present invention.

Refer to FIG. 7. FIG. 7 is a schematic view showing the circuit structure of the scan driving unit SDi according to another embodiment of the present invention. The structure of the scan driving unit SDi is basically the same as the scan driving unit SDn, with the difference that the transistors T1-T17 are all P-channel Metal Oxide Semiconductor PMOS).

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A scan driving circuit, comprising: n sequentially cascaded scan driving units, each of the n sequentially cascaded scan driving units comprising: an activation trigger end, a scan signal output end and a plurality of clock signal ends, wherein the activation trigger end of an i-th scan driving unit of the n sequentially cascaded scan driving units is electrically connected to the scan signal output end of an (i−1)-th scan driving unit of the n sequentially cascaded scan driving units, and the scan signal output end of the i-th scan driving unit of the n sequentially cascaded scan driving units outputs a scan signal and is electrically connected to the activation trigger end of an (i+1)-th scan driving unit of the n sequentially cascaded scan driving units; each scan driving unit of the n sequentially cascaded scan driving units comprising:

an input unit electrically connected to the activation trigger end of said each scan driving unit; and an output unit electrically connected to the scan signal output end of said each scan driving unit; wherein the input unit receives an activation trigger signal and transmits the activation trigger signal to the output unit, and controls the output unit to be in a scanning state;

wherein said each scan driving unit further comprises a scan signal modulation unit having a plurality of transistors connected in a diode manner, the plurality of the transistors being connected to the plurality of clock signal ends and outputting a clock modulation signal according to at least three clock signals, the clock modulation signal comprising a repeating pattern of a high voltage and a low voltage and a predetermined duration between the repeating pattern; the output unit outputting a scan driving signal from the scan signal output end in response to the clock modulation signal when in the scanning state; the scan signal comprising two sub-scan signals spaced apart for the predetermined duration; each of the two sub-scan signals corresponding to one of the high and low voltages of the clock modulation signal for controlling a pixel unit receiving an image signal in a scan cycle, wherein the pixel unit comprising two sub-pixels, n being a first natural number greater than 1, and i being a second natural number greater than 0 and less than n.

2. The scan driving circuit as claimed in claim 1, wherein for said each scan driving unit, the scan signal modulation unit comprises a signal modulation output point, and the scan signal modulation unit comprises a plurality of transistors connected in the diode manner and a buffer transistor, wherein the transistors are connected in the diode manner have sources electrically connected to the signal modulation output point and drains electrically connected respectively to a corresponding number of scan clock signal ends; the buffer transistor has a drain electrically connected to the signal modulation output point, a gate electrically connected to a buffer clock signal end, and a source electrically connected to a buffer voltage end having a second voltage; wherein a scan clock signal loaded in by the scan signal output end controls the clock modulation signal to have one of the high and low voltages through the transistors; a buffer clock signal loaded in by the buffer clock signal end makes the clock modulation signal have the second voltage during the predetermined duration; the second voltage makes the scan signal output end stop outputting the scan signal and output a buffer scan signal, and the buffer scan signal controls the pixel unit to stop receiving the image signal.

3. The scan driving circuit as claimed in claim 2, wherein for said each scan driving unit, the scan signal modulation unit comprises three transistors connected in the diode manner, and one of the three transistors connected in the diode manner controls the clock modulation signal to have one of the high and low voltages at a time before the predetermined duration, and the other two transistors control the clock modulation signal to have one of the high and low voltages at a time after the predetermined duration so that the clock modulation signal has one of the high and low voltages for different continuous durations at the time before the predetermined duration and at the time after the predetermined duration and the two sub-scan signals have continuous durations that are different.

4. The scan driving circuit as claimed in claim 3, wherein for said each scan driving unit, the output unit has a output control point, an output control transistor and a voltage maintaining capacitor; the output control point receives the activation trigger signal; the voltage maintaining capacitor maintains the output control point in the scanning state; the output control transistor has a gate electrically connected to the output control point, a source electrically connected to the signal modulation output point, and a drain electrically connected to the scan signal output end; when the output control point is in the scanning state, the output control transistor is in a conductive state, corresponding to the clock modulation signal outputting the scan signal.

5. The scan driving circuit as claimed in claim 4, wherein for said each scan driving unit, the input unit comprises an input transistor, which has a gate electrically connected to the activation trigger end of said each scan driving unit to receive the activation trigger signal, and a source receiving one of the high and low voltages; when the activation trigger signal controls the input transistor to become conductive, one of the high and low voltages is outputted through a drain of the input transistor, and one of the high and low voltages is for controlling the output control point to be in the scanning state in which the output control transistor is in the conductive state.

6. The scan driving circuit as claimed in claim 5, wherein said each scan driving unit further comprises a regulator unit, the regulator unit is electrically connected between the drain of the input transistor and the output control point; the regulator unit comprises a regulation transistor, the regulation transistor has a gate receiving one of the high and low voltages and making the regulation transistor in the conductive state under the control of the one of the high and low voltages, the regulation transistor has a source electrically connected to the drain of the input transistor, and a drain electrically connected to the output control point.

7. The scan driving circuit as claimed in claim 4, wherein said each scan driving unit further comprises a first pull-down unit, which comprises a first pull-down control point, a first pull-down transistor, and a pull-down maintaining capacitor; the first pull-down control point receives a pull-down control signal; the first pull-down transistor has a gate electrically connected to the first pull-down control point, a source electrically connected to a second voltage source having the second voltage, and a drain electrically connected to the scan signal output end; the pull-down control signal controls the scan signal output end to output a buffer signal having the second voltage; and the buffer signal controls the pixel unit to pause receiving a data voltage.

8. The scan driving circuit as claimed in claim 7, wherein said each scan driving unit further comprises a pull-down control unit, which outputs a pull-down control signal; the pull-down control unit comprises a first pull-down control transistor and a second pull-down control transistor; the first pull-down control transistor has a gate electrically connected to the output control point, a source electrically connected to a pull-down clock signal end for receiving a pull-down clock signal, and a drain electrically connected to the first pull-down control point; the second pull-down control transistor has a gate electrically connected to the pull-down clock signal end, a source electrically connected to one of the high and low voltages, and a drain electrically connected to the first pull-down control point; wherein the pull-down clock signal is in an enable state with the high voltage after the scan driving unit receives the activation trigger signal and two scan signals have been output from the scan signal output end, the pull-down clock signal is used to control the pull-down control signal having the high voltage, and the pull-down control signal having the high voltage is used to control the scan signal output end to output the buffer signal with the second voltage.

9. The scan driving circuit as claimed in claim 4, wherein said each scan driving unit further comprises a second pull-down unit; the second pull-down unit comprises a second pull-down control point, a second pull-down transistor, a third pull-down transistor, a fourth pull-down transistor, and a pull-down maintaining transistor; the second pull-down control point, when receiving a pull-down control signal, controls the scan signal output end to stop outputting the scan signal; the second pull-down transistor has a gate electrically connected to the first control point, a source electrically connected to the second voltage end, and a drain electrically connected to the respective scan signal output end; the pull-down control signal is for controlling the scan signal output end; the buffer signal controls the pixel unit to pause receiving a data voltage; the third pull-down transistor has a gate electrically connected to the activation trigger end, a source electrically connected to the high voltage, and a drain electrically connected to the second pull-down control point; the fourth pull-down transistor has a gate electrically connected to the scan clock signal end, a source electrically connected to the second voltage end, and a drain electrically connected to the second pull-down control point.

10. The scan driving circuit as claimed in claim 1, wherein the n sequentially cascaded scan driving units comprises odd-numbered scan driving units, which are collectively referred to as a first set, and even-numbered scan driving units, which are collectively referred to as a second set; the odd-numbered scan driving units of the first set are connected to a first set of clock signal ends, and the even-numbered scan driving units of the second set are connected to a second set of clock signals; wherein some of the clock signal ends of the first set are included in the second set.

11. An array substrate, comprising: a first region and a second region, wherein the first region comprises 2n scan lines and a plurality of pixel units electrically connected to the 2n scan lines, the 2n scan lines being insulated and arranged in parallel to each other; the second region is provided with two scan driving circuits each of which is as claimed in claim 1, with each of the n sequentially cascaded scan driving units electrically connected to one of the 2n scan lines for outputting the scan signal to a pixel unit of the plurality of pixel units electrically connected to the one of the 2n scan lines for controlling the pixel unit to receive the image signal; wherein the two scan driving circuits are provided at opposite ends of the 2n scan lines, and any two adjacent ones of the 2n scan lines are respectively connected to the two scan driving circuits; wherein the two scan driving circuits are formed with a same process as the plurality of pixel units.

12. The array substrate as claimed in claim 11, wherein for said each scan driving unit of each of the two scan driving circuits, the scan signal modulation unit comprises a signal modulation output point, and the scan signal modulation unit comprises a plurality of transistors connected in the diode manner and a buffer transistor, wherein the transistors connected in the diode manner have sources electrically connected to the signal modulation output point and drains electrically connected respectively to a corresponding number of scan clock signal ends; the buffer transistor has a drain electrically connected to the signal modulation output point, a gate electrically connected to a buffer clock signal end, and a source electrically connected to a buffer voltage end having a second voltage; wherein a scan clock signal loaded in by the scan signal output end controls the clock modulation signal to have one of the high and low voltages through the transistors; a buffer clock signal loaded in by the buffer clock end makes the clock modulation signal have the second voltage during the predetermined duration; the second voltage makes the scan signal output end stop outputting the scan signal and output a buffer scan signal, and the buffer scan signal controls the pixel unit to stop receiving the image signal.

13. The array substrate as claimed in claim 12, wherein for said each scan driving unit of each of the two scan driving circuits, the scan signal modulation unit comprises three transistors connected in the diode manner, and one of the three transistors connected in the diode manner controls the clock modulation signal to have one of the high and low voltages at a time before the predetermined duration, and the other two transistors control the clock modulation signal to have one of the high and low voltages at a time after the predetermined duration so that the clock modulation signal has one of the high and low voltages for different continuous durations at the time before the predetermined duration and at the time after the predetermined duration and the two sub-scan signals have continuous durations that are different.

14. The array substrate as claimed in claim 13, wherein the first region comprises 2m data lines that are arranged serially and are mutually parallel and are insulated from each other, wherein the 2m data lines are disposed in a direction perpendicular to the 2n scan lines, and the plurality of pixel units are electrically connected respectively with the 2m data lines and the 2n scan lines; each of the plurality of pixel units comprises two sub-pixel units, and the two sub-pixel units are connected to a same one of the 2n scan lines and are connected respectively to two adjacent ones of the 2m data lines; the two sub-pixel units receive two scan signals separated with the predetermined duration within a scan cycle, wherein m is a third natural number greater than 1.

15. A display panel, comprising an array substrate as claimed in claim 14, and an opposite substrate disposed opposite to the array substrate, wherein the display panel comprises an active area for image displaying and a non-active area surrounding the active area; and wherein the first region of the array substrate corresponds to the active area, and the second region corresponds to the non-active area.

* * * * *